(12) United States Patent
Itakura

(10) Patent No.: US 7,032,155 B2
(45) Date of Patent: Apr. 18, 2006

(54) DATA REGENERATING APPARATUS

(75) Inventor: Akihiro Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 523 days.

(21) Appl. No.: 10/309,980

(22) Filed: Dec. 4, 2002

(65) Prior Publication Data
US 2003/0140297 A1    Jul. 24, 2003

(30) Foreign Application Priority Data
Jan. 24, 2002   (JP)   ............. 2002-016136

(51) Int. Cl.
*H03M 13/03*   (2006.01)
(52) U.S. Cl. ................. 714/755; 714/786
(58) Field of Classification Search ........... 714/746, 714/752, 755, 786, 792, 795
See application file for complete search history.

(56) References Cited

U.S. PATENT DOCUMENTS 6,182,261 B1 *   1/2001   Haller et al. .............. 714/758

FOREIGN PATENT DOCUMENTS

EP   1267346 A1 *   12/2002
JP   2000-183758   6/2000
JP   2001-44855   2/2001

OTHER PUBLICATIONS

Bajesy et al., Iterative decoding for digital recording systems, 1998, IEEE, p. 2700-2705.*
"Performance of High Rate Turbo Codes on a PR4-Equalized Magnetic Recording Channel"; William E Ryan; *IEEE Int'l Conf. on Communications*; pp. 947-951; 1998.

* cited by examiner

*Primary Examiner*—Shelly Chase
(74) *Attorney, Agent, or Firm*—Greer, Burns & Crain, Ltd.

(57) ABSTRACT

A data regenerating apparatus that generates decoded data by performing a decoding process on a readout signal from a storage medium according to an iterative decoding technique corresponding to a turbo coding technique, and regenerates recorded data by performing a predetermined error correction process on the decoded data is disclosed. The apparatus includes an error state detector configured to detect an error state of the decoded data; a first determination unit configured to determine whether or not the error state of the decoded data detected by the error state detector is correctable in the predetermined error correction process; and, a decoding controller configured to stop the decoding process when it is determined by the first determination unit that the error state of the decoded data is correctable in the predetermined error correction process.

12 Claims, 14 Drawing Sheets

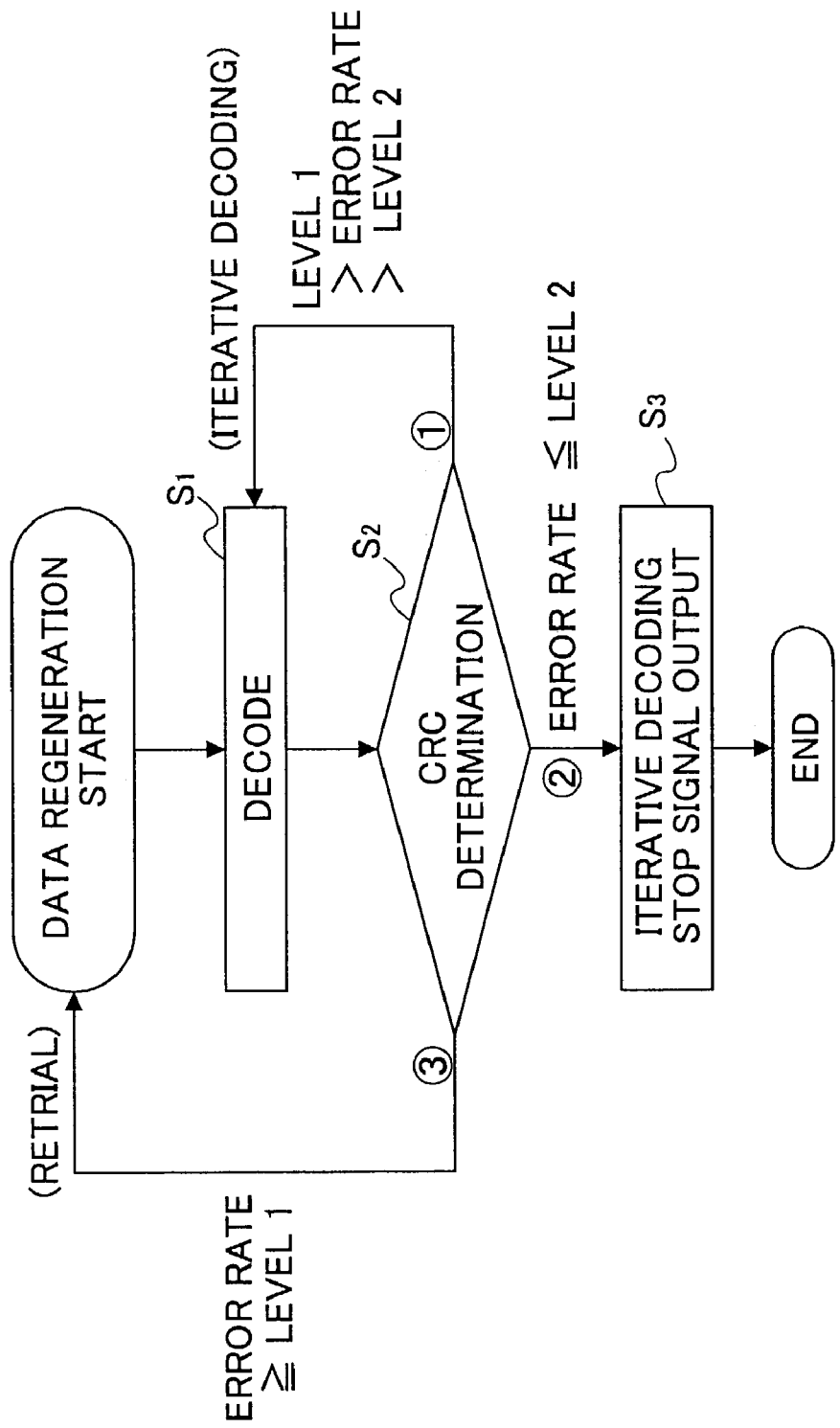

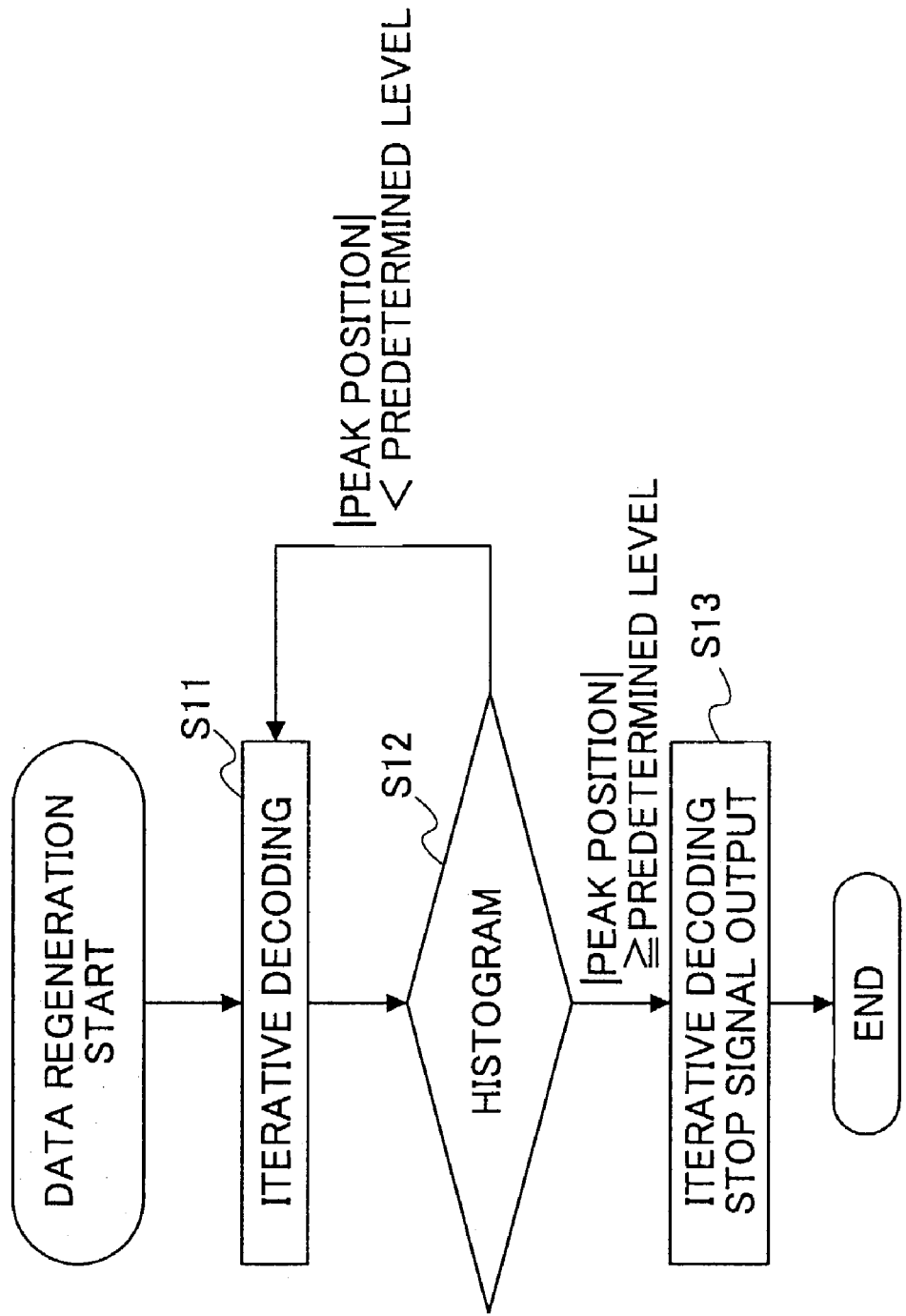

DATA REGENERATING APPARATUS

BACKGROUND OF THE INVENTION

1. Field of the Invention

The present invention relates generally to a data regenerating apparatus such as a magnetic disk unit, an optical disk unit, or a magnetic tape unit, and particularly to a data regenerating apparatus that regenerates recorded data from a storage medium using an iterative decoding technique corresponding to a turbo coding technique.

2. Description of the Related Art

Turbo coding is an encoding technique with a large coding gain, and this technique has attracted much attention in the communications field. A turbo coding device generally encodes a data bit sequence u with two recursive systematic convolutional encoders, and may be arranged into a structure as shown in FIG. 1 or 2.

In FIG. 1, the turbo coding device comprises a first encoder 11, an interleaver (π1) 12, a second encoder 13, and a synthesizer 14. The data bit sequence u is supplied to the first encoder 11 as well as to the second encoder 13 via the interleaver (π1) 12.

The first encoder 11 and the second encoder 13 are recursive systematic convolutional encoders, and the first encoder 11 generates a corresponding parity bit sequence p1 from the input data bit sequence u. Also, the interleaver (π1) 12 outputs a signal sequence in which the bit order of the input data bit sequence u is rearranged. The second encoder 13 generates a corresponding parity bit sequence p2 from the signal sequence from the interleaver (π1) 12.

The synthesizer (MUX/puncture) 14 generates an encoded data bit sequence yk by combining the above data bit sequence u, the parity bit sequence p1 output from the first encoder 11, and the parity bit sequence p2 output from the second encoder 13, according to a predetermined rule. Also, upon combining the data bit sequence u, the parity bit sequence p1, and the parity bit sequence p2, the synthesizer (MUX/puncture) 14 thins out the bits according to a predetermined rule (puncture function), thereby raising the coding rate. The encoded data bit sequence yk generated in the manner described above is output from the turbo coding device. In a communication system, the encoded data bit sequence yk is modulated according to a predetermined rule and is transmitted from a transmission device.

Additionally, in the turbo coding device of FIG. 2, the two recursive systematic convolutional encoders (the first encoder 11 and the second encoder 13) are arranged in a straight line. In this example, the data bit sequence u is encoded in the first encoder 11, and then the interleaver (π1) 12 changes the bit order of the signal sequence obtained from the above encoding process. The signal sequence output from the interleaver (π1) 12 is then encoded in the second encoder 13, and the signal sequence obtained from the above encoding process is output as the encoded data bit sequence yk.

When the signal transmitted from the transmission device as described above is received at the reception device, the received signal is demodulated and the signal value sequences U, Y1, and Y2 each corresponding to the data bit sequence u, and the parity bit sequences p1 and p2 contained in the encoded data bit yk are obtained. These signal value sequences U, Y1, and Y2 are input to the decoding device corresponding to the above turbo coding device.

In this decoding device, soft output decoding is performed in two decoders that correspond to the above-described two encoders, and the soft output information (likelihood information) corresponding to each of the information bits obtained from one of the decoders is provided to the other decoder as prior information. The above described process is iteratively performed. For, example, the decoding device for processing the decoded signal sequences U, Y1, and Y2 each corresponding to the bit sequences u, p1, and p2 contained in the encoded data bit sequence yk, which is output from the turbo encoding device shown in FIG. 1, can be arranged to have a structure as shown in FIG. 3.

In FIG. 3, the decoder comprises a first soft in soft out (SISO) decoder 21, interleavers (π1) 22 and 23, a deinterleaver (π1$^{-1}$) 25, a second soft in soft out (SISO) decoder 24, and a hard decision unit 26. The first SISO decoder 21 corresponds to the above-mentioned first encoder 11, and the second SISO decoder 24 corresponds to the above-mentioned second encoder 13.

The first SISO decoder 21 inputs the received signal value sequences U and Y1, as well as the prior information Lu from the second SISO decoder 24, and performs maximum a posteriori (MAP) probability decoding in order to estimate the posterior probability of each bit. The posterior probability is the probability of the bit uk being "0" or "1" upon detecting the signal value sequence Y (y0, y1, ..., yk, ..., yn). In a MAP decoding process, the logarithmic likelihood ratio L(u*), which is the logarithmic ratio of the posterior probability P (uk|Y), is calculated as:

$$L(u^*) = L(uk|Y) = \ln\{P(uk=1|Y)/P(uk=0|Y)\} \quad (1)$$

In the above equation (1), the signal value sequence Y is the received signal value sequence U and Y1.

The probability P(uk=1|Y) of the above bit uk being "1" and the probability P(uk=0|Y) of the bit uk being "0" are calculated based on a trellis diagram indicating the state transition obtained from the signal value sequences U and Y1.

Also, the logarithmic likelihood ratio L(u*) can be expressed as:

$$L(u^*) = Lc \cdot yk + L(uk) + Le(uk) \quad (2)$$

Lc·yk: communication path value (Lc: a constant determined by the S/N ratio (communication path constant) yk: received signal series y0, y1, ... ,yn)

L(uk): prior information, which is the already-known probability of either uk=1 or uk=0

Le(uk): external likelihood information concerning uk that can be obtained from the controlling of codes From the above equation (2), the first SISO decoder 21 calculates the external likelihood information Le(uk) according to the following equation:

$$Le(uk) = L(u^*) - Lc \cdot yk - L(uk) \quad (3)$$

By substituting the logarithmic likelihood ratio L(u*) as computed in the manner described above (refer to equation (1)) into equation (3), the external likelihood information Le(uk) can be obtained. In this way, the sequence of the successively obtained external likelihood information is supplied to the second SISO decoder 24 via the interleaver ($\pi$1) 23 as a sequence of prior information L(uk). Aside from the above prior information L(uk), the second SISO decoder 24 also receives the signal value sequence U input to the decoder device via the interleaver ($\pi$1) 22 as well as the signal value sequence Y2.

The second SISO decoder 24 calculates a new logarithmic likelihood ratio L(u*) based on the above equation (1) while also taking into account the input prior information L(uk). Then, the external likelihood information Le(uk) is calculated in accordance with the above equation (3) using the above obtained logarithmic likelihood ratio L(u*) and prior information L(uk) supplied from the first SISO decoder 21.

The external likelihood information Le(uk) obtained in the second SISO decoder 24 is supplied to the first SISO decoder 21 via the deinterleaver ($\pi1^{-1}$) 25 as prior information L(uk). Then, the first STSO decoder 21 calculates the logarithmic likelihood ratio L(u*) and the external likelihood information Le (uk) in accordance with the procedures described above while also taking into account the prior information L(uk) This external likelihood information Le (uk) is used as prior information L(uk) for the second SISO decoder 24.

As described above, both the first SISO decoder 21 and the second SISO decoder 24 iteratively perform the process of calculating the logarithmic likelihood ratio L(u*) using the external likelihood information Le(uk) calculated at the other decoder as prior information L(uk) (iterative decoding). It is be noted that in the first process of the first SISO decoder 21, the prior information L(uk) is zero (L(uk)=0).

The hard decision unit 26 determines whether the bit uk is "0" or "1" based on the logarithmic likelihood ratio L(u*) obtained in the second SSO decoder 24 after the above described decoding process is repeated for a predetermined number of times. For example, the bit uk is determined to be "1" (uk=1) if the logarithmic likelihood ratio L(u*) is positive (L(u*)>0), and the bit uk is determined to be "0" (uk=0) if the above ratio is negative (L(u*)<0). The decision result is then output as the decoded result Uk.

As the above decoding process is repeated (iterative decoding), the probability of the bit uk taking the appropriate value (either 0 or 1) gradually increases and the probability of the bit uk not taking the appropriate value decreases (i.e. the difference between the probability of the bit uk being "1" and the probability of the bit uk being "0" increases), and thus the reliability of the decision made by the hard decision unit 26 can be increased.

Attempts are being made to incorporate the above described turbo coding/decoding technique implemented in a communication system to a data recording/regenerating apparatus such as a magnetic disk unit or an optical disk unit. For example, a description of such attempts can be found in: W. E. Ryan, "Performance of High Rate Turbo Codes on a PR4-Equalized Magnetic Recording Channel", Proc. IEEE Int. Conf. on Communications, pp947–951, 1998, wherein a magnetic disk unit implementing a turbo coding/decoding technique is disclosed.

In such a data recording/regenerating apparatus, the above-described turbo coding technique is used in the recording system for writing data into a storage medium (write system), and the above iterative decoding technique is used in the regenerating system for regenerating data from the storage medium (read system). By incorporating these techniques into the data recording/regenerating apparatus, data that is densely stored in a storage medium (e.g. a magnetic disk, an optical disk (including a magneto-optic disk), and a magnetic tape) can be regenerated with very few errors.

In a data regenerating apparatus that performs a data decoding process using the above-described iterative decoding technique, the data detection capacity increases as the number of iterations of the decoding process increases. However, increasing the number of iterations of the decoding process will lead to an increase in the time required in completing the decoding process, thereby lowering the transfer rate of the data regenerating apparatus.

SUMMARY OF THE INVENTION

The object of the present invention is to provide a data regenerating apparatus that enables an accurate data decoding process while keeping the degradation of the transfer rate of the device down to a minimum.

To this end, the present invention provides a data regenerating apparatus that generates decoded data by performing a decoding process on a readout signal from a storage medium according to an iterative decoding technique corresponding to a turbo coding technique, and regenerates recorded data by performing a predetermined error correction process on the decoded data, the data regenerating apparatus having an error state detector configured to detect an error state of the decoded data; a first determination unit configured to determine whether or not the error state of the decoded data detected by the error state detector is correctable using the predetermined error correction process; and, a decoding controller configured to stop the decoding process when it is determined by the first determination unit that the error state of the decoded data is correctable in the predetermined error correction process.

In such a data regenerating apparatus, the decoding process is iteratively performed until the error state of the acquired decoded data is correctable using a predetermined error correction process. Thus, even when the decoding process is not repeated until the acquired decoded data is completely error-free, a more accurate regeneration of data can be realized by effectively utilizing the above-mentioned predetermined error correction process.

It is noted that the present invention is not concerned with the manner in which the above-described error state of the decoded data is represented. The error state can be represented as the error rate, the absolute value of the error bit, or some other form of representation.

Also, the above-described predetermined error correction process is not restricted to a certain type of technique, but instead is open to any technique that enables the accurate identification of the error location of the decoded data and the correction of this error location such as the error correction code (ECC) method.

Further, from the aspect of keeping the degradation of the transfer rate down to a minimum, the present invention provides the above-described data regenerating apparatus further having a second determination unit configured to determine whether or not the error state detected by the error state determination unit for the decoded data obtained upon performing the decoding process for a predetermined number of times according to the iterative decoding technique has more errors compared to a predetermined standard error state; and a retrial controller configured to retry the process of regenerating the recorded data when it is determined by the second determination unit that the error state detected by the error state detector has more errors than the predetermined standard error state.

As for the determination method, when the decoding operation is performed once, twice, and so on, and the difference between the error states of the resulting decoded data from each operation is less than a predetermined value, it is determined that the data regeneration process should be retried.

Also, the above predetermined number of times, namely, the number of iterations of the decoding process performed before obtaining the decoded data for deciding on (or against) the retrial of the above data regeneration process using its error state, is preferably the smallest number possible. For example, the necessity of a retrial of the data regenerating process can be determined depending on whether or not the error state detected in the above error state detector for the decoded data obtained upon performing the decoding process once has more errors compared to the predetermined standard state.

The present invention further provides a data regenerating apparatus that generates decoded data by performing a decoding process on a readout signal from a storage medium according to an iterative decoding technique corresponding to a turbo coding technique, and regenerates recorded data based on the decoded data, the data regenerating apparatus having an iteration number controller configured to control the number of iterations of the decoding process based on a distribution state of likelihood information obtained during the decoding process according to the iterative decoding technique.

In the decoding process according to the iterative decoding technique in such data regenerating apparatus, likelihood information representing the likelihood of the data is generated from the readout signal, and the decoded data (hard decision result) is generated by performing hard decision on the likelihood information. This likelihood information can be, for example, the logarithmic likelihood ratio obtained based on the ratio of the probability of a bit being "1" to the probability of the bit being "0" under the condition that a readout signal is obtained.

The distribution state of the likelihood information for each bit affects the reliability of the hard decision result of that likelihood information. The reliability of the hard decision result of the likelihood information can be improved in a distribution state of likelihood information with a stronger likelihood of the data. Normally, the reliability of the hard decision result of the likelihood information improves upon increasing the number of iterations of the decoding process. Thus, the number of iterations of the decoding process is controlled based on the distribution state of the likelihood information obtained in the decoding process. In this way, a hard decision result (decoded data) with a predetermined level of reliability can be obtained.

The above iteration number controller may have a determination unit configured to determine whether or not the distribution state of the likelihood information has higher reliability in a hard decision result of the likelihood information compared to that of a predetermined standard state; and a decoding controller configured to stop the decoding process when it is determined in the determination unit that the distribution state of the likelihood information has higher reliability in the hard decision result of the likelihood information compared to that of the predetermined standard state.

The above-mentioned predetermined standard state is determined based on the specification of the data regenerating apparatus and the like. For example, in a case in which the error correction process is further performed on the decoded data, the above predetermined standard state can be determined based on the distribution state of the likelihood information whose reliability of the hard decision result from this likelihood information allows errors correctable in the above error correction process.

To this end, the present invention further provides a data regenerating apparatus that generates decoded data by performing a decoding process on a readout signal from a storage medium according to an iterative decoding technique corresponding to a turbo coding technique, and regenerates recorded data based on the decoded data, the data regenerating apparatus having a quality information detector configured to detect quality information indicating the quality of the readout signal; and an iteration number controller configured to control the number of iterations of the decoding process based on the quality information detected by the quality information detector.

In such a data regenerating apparatus, the number of iterations of the decoding process is controlled based on the quality information of the readout signal. As a result, decoded data with the desired reliability can be obtained with fewer iterations of the decoding process when the quality of the readout signal is good.

When the waveform of the readout signal is distorted by noise and the like, the distribution state of the sample values obtained by sampling the readout signal in a predetermined cycle and rendered to the decoding process will be spread out. In other words, the quality of the readout signal can be determined from the histogram of the sample values. From this aspect, the present invention provides the above data regenerating apparatus, wherein the quality information detector further comprises a histogram generating unit configured to generate a histogram of sample values that are produced by sampling the readout signal in a predetermined cycle and are rendered to the decoding process, and a quality information computing unit configured to compute information indicating the distribution state of the sample values represented in the histogram generated in the histogram generating unit as the quality information of the readout signal; and the iteration number controller further comprises a first iteration number determination unit configured to determine the number of iterations of the decoding process based on the information indicating the distribution state of the sample values obtained in the quality information computing unit, and performs the decoding process for the number of times determined by the first iteration number determination unit.

From the aspect of facilitating the decision process of the number of iterations of the decoding process, the above first iteration number determination unit may have a first table indicating the number of iterations of the decoding process appropriate for each of a plurality of distribution states of the sample values; and, referring to this first table, may determine the number of iterations of the decoding process by obtaining the number of iterations that corresponds to the information indicating the distribution state of the sample values obtained in the quality information computing unit.

Also, from the aspect of directly obtaining the quality of the readout signal, the present invention provides the above data regenerating apparatus, wherein the quality information detector detects information indicating the amplitude of a noise component included in a readout signal with a predetermined pattern prerecorded on the storage medium as quality information of the readout signal of the recorded data; and the iteration number controller comprises a second iteration number determination unit for determining the number of iterations of the decoding process based on the information indicating the amplitude of the noise component included in the readout signal of the predetermined pattern obtained in the quality information detector, and performs the decoding process for the number of times determined by the second iteration number determination unit.

The above information indicating the amplitude of the noise component may represent the relative amplitude of the noise component in relation to the signal component, which is the chief component of the readout signal, or it may represent the noise component in absolute terms.

Also, the above second iteration number determination unit may have a second table indicating the appropriate number of iterations of the decoding process corresponding to each of a plurality of noise component amplitudes; and, referring to this second table, may determine the number of iterations of the decoding process by obtaining the number of iterations corresponding to the information on the amplitude of the noise component included in the readout signal with the predetermined pattern obtained in the quality information detector.

Further, the present invention provides a data regenerating apparatus that generates decoded data by performing a decoding process on a readout signal from a storage medium according to an iterative decoding technique corresponding to a turbo coding technique, and regenerates recorded data based on the decoded data, the data regenerating apparatus having a determination unit configured to determine whether or not the error state detected in the error state detector for the decoded data obtained upon performing the decoding process for a predetermined number of times according to the iterative decoding technique has more errors compared to a predetermined standard error state; and a retrial controller for retrying the process of regenerating the recorded data when it is determined by the determination unit that the error state detected in the error state detector has more errors than the predetermined standard error state.

From the aspect of holding down the decline of the efficiency of the data regeneration process to a minimum, the above determination unit determines whether or not the error state detected by the error state detector for the decoded data obtained upon performing the decoding process once has more errors compared to the predetermined standard error state.

BRIEF DESCRIPTION OF THE DRAWINGS

FIG. 7 is a flow chart illustrating an example of the processing procedures for controlling the number of iterations of the decoding process;

FIG. 10 is a flow chart illustrating an example of the processing procedures of the controller in the structure shown in FIG. 9;

DESCRIPTION OF THE PREFERRED EMBODIMENTS

In the following, a description of the preferred embodiments of the present invention is given with reference to the accompanying drawings.

Figure 4:
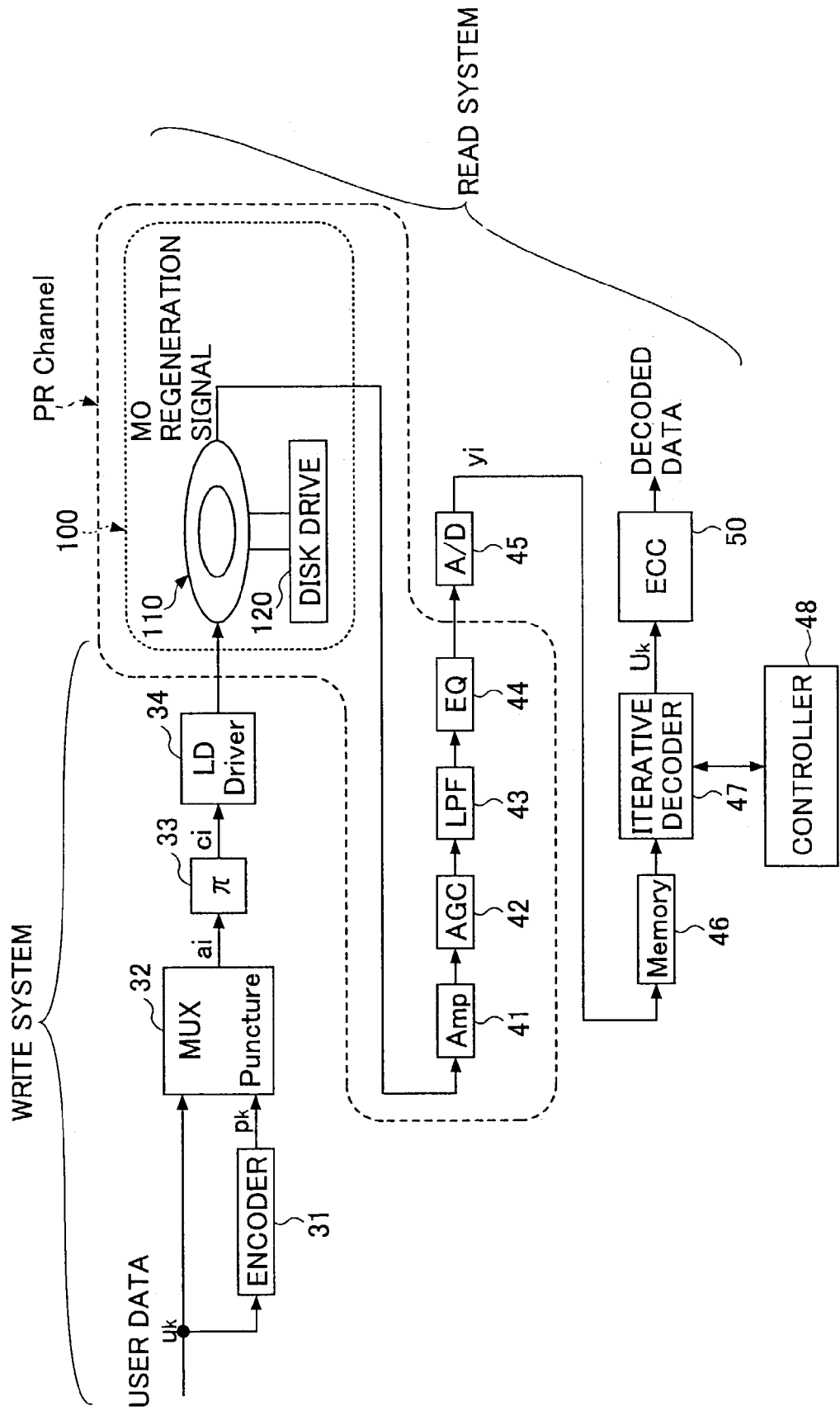
FIG. 4 is a block diagram illustrating the data regenerating apparatus according to an embodiment of the present invention.

A data regenerating apparatus according to an embodiment of the present invention may have, for example, a structure as shown in FIG. 4. In FIG. 4, the data regenerating apparatus is implemented as the read system of the data recording/regenerating apparatus, which performs the recording and regeneration of data.

The data recording/regenerating apparatus shown in FIG. 4 is an optical disk unit using a magneto-optic disk (MO) 110 as the storage medium, comprising a recording/regenerating mechanism 100, a write system for writing data onto a magneto-optic disk 110, and a read system for regenerating data from the magneto-optic disk 110. The above recording/regenerating mechanism 100 has an optical head (not shown) provided with a light beam output unit (e.g. laser diode (LD)), a light detector (e.g. photodiode), and a disk drive 120 for rotating the magneto-optic disk 110 at a predetermined speed.

Figure 5:
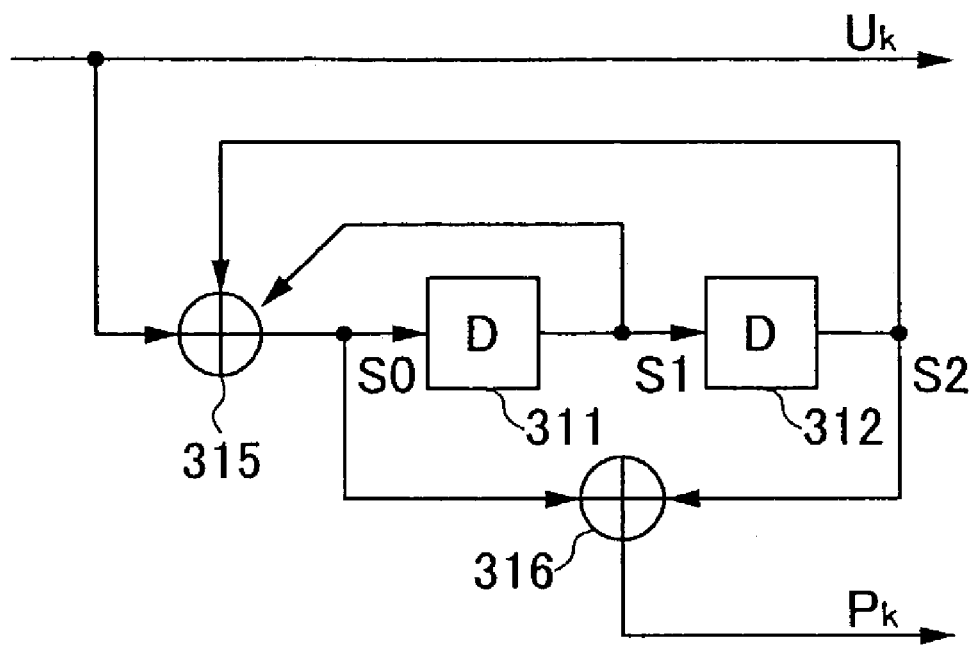
FIG. 5 is a block diagram illustrating an exemplary structure of the encoder in the write system of the device shown in FIG. 4.

The write system has an encoder 31, a combiner 32, an interleaver 33, and an LD drive circuit 34. The encoder 31 may be, for example, a recursive systematic convolutional encoder comprising two delay elements 311, 312 and two exclusive OR gates 315 and 316 as shown in FIG. 5, wherein the encoder 31 generates a parity bit sequence pk corresponding to user data uk that is to be recorded by performing an encoding process at constraint length=3 on the user data uk.

The combiner 32 combines user data uk and the parity bit sequence pk generated at the encoder 31 according to a predetermined rule, and thins out the bits of the bit sequence obtained from the combination process according to a predetermined rule (puncture function) to generate encoded data bit sequence ai. Interleaver ($\pi$) 33 changes the order of the bits in the encoded data bit sequence ai generated at the combiner 32 according to a predetermined rule to produce encoded data bit sequence ci.

The LD driver circuit 34 controls the operation of the light beam output unit of the recording/regenerating mechanism 100 based on the encoded data bit sequence ci. A signal is written onto the magneto-optic disk 110 by means of the light beam from the light beam output unit controlled based on the encoded data bit sequence ci. The writing of the signal onto the magneto-optic disk 110 is performed with a high density so that interference of a predetermined waveform is generated upon the regeneration of the signal.

Figure 1:
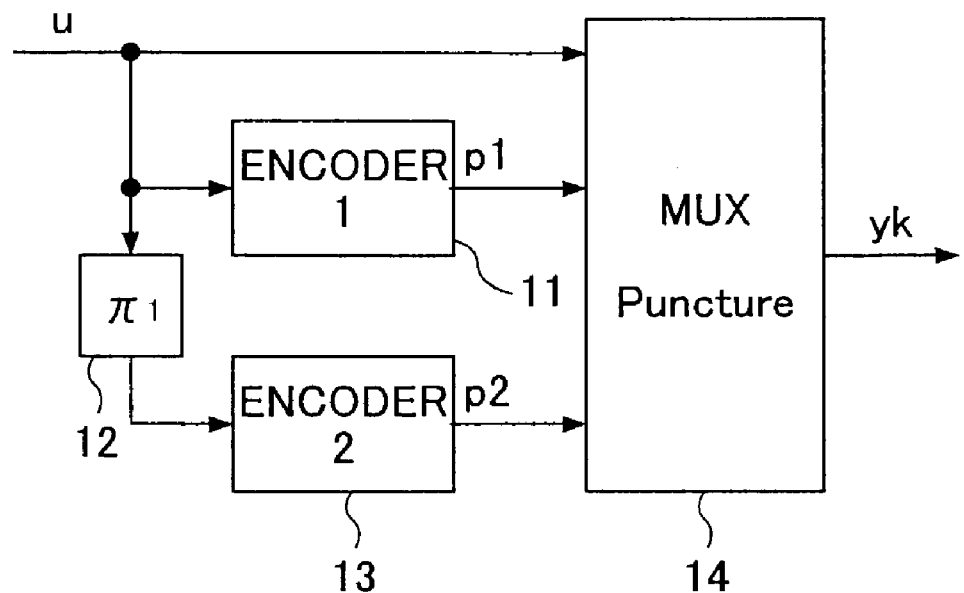
FIG. 1 is a block diagram illustrating an exemplary structure of the turbo coding device.
Figure 2:
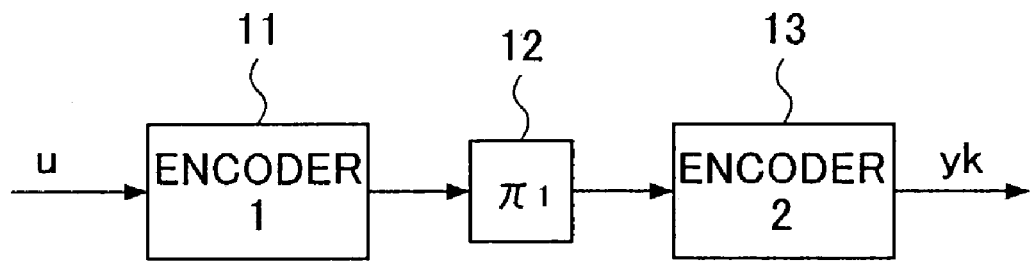
FIG. 2 is a block diagram illustrating another exemplary structure of the turbo coding device.
Figure 3:
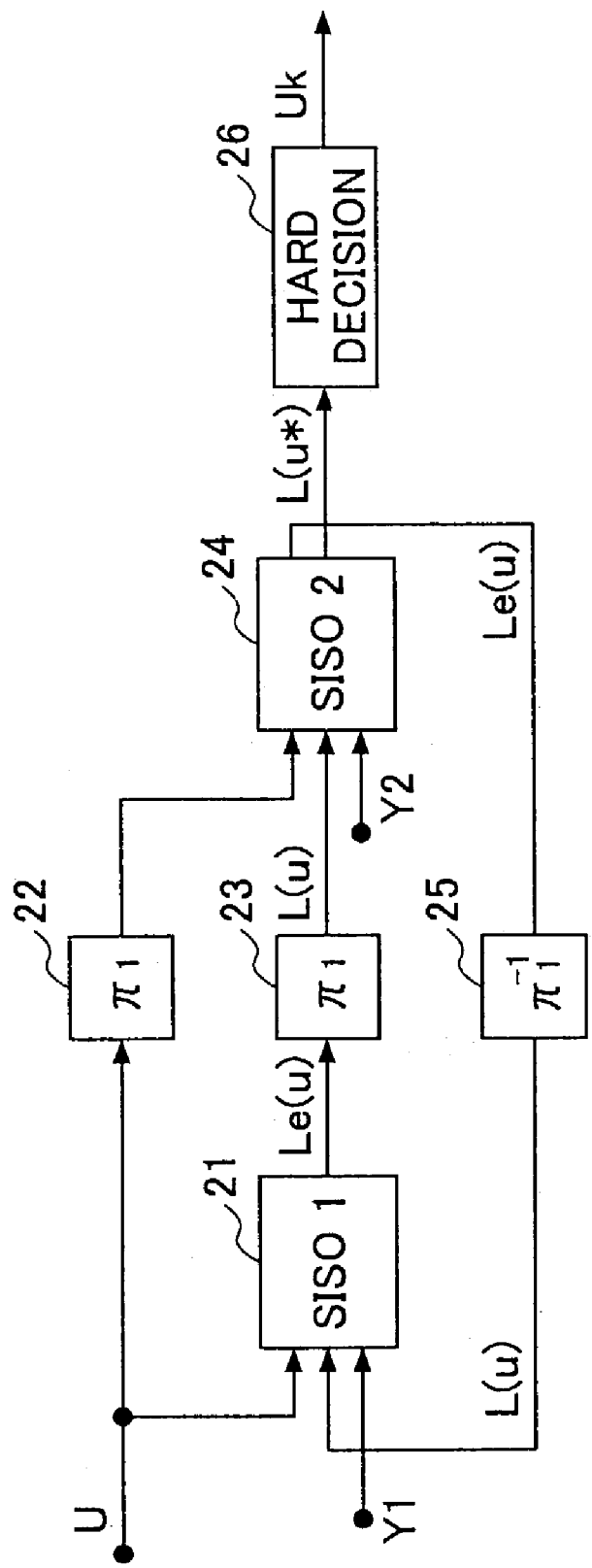
FIG. 3 is a block diagram illustrating an exemplary structure of a decoding device corresponding to the turbo coding device shown in FIG. 1.

Also, the read system of the data recording/regenerating apparatus comprises an amp 41, an AGC (auto gain controller) 42, a low pass filter 43, an equalizer 44, and an analog-to-digital converter (referred to as A/D hereinafter) 45. Waveform shaping is performed on the MO readout signal output from the light detector of the recording/regenerating mechanism 100 so that the signal can be recognized by the amp 41, the AGC 42, the low pass filter 43, and the equalizer 44 as having a PR waveform (partial response waveform). In other words, the readout signal from the magneto-optic disk 110 will substantially be encoded at a PR channel. Thus, the turbo coding device shown in FIG. 2 is provided with the substantial encoding functions of the write system (encoder 31) and its PR channel.

Additionally, the read system has a memory unit 46, an iterative decoder 47, a controller 48, and an ECC decoder circuit 50. The signal with an equalized waveform is converted to a digital value (sample value) by the A/D 45 at a predetermined period, and the sample value yi successively being output by the A/D 45 is stored in the memory unit 46. Then the sample value yi stored in the memory unit 46 is decoded at the iterative decoder 47 (turbo decoding). The controller 48 controls the operation and decoding conditions of the iterative decoder 47. The iterative decoder iteratively performs a decoding process and outputs the regenerated data sequence Uk.

The ECC decoder circuit 50 performs correction decoding on the data bit sequence Uk output from the iterative decoder 47 based on an ECC (error correcting code) to produce the final decoded data.

Figure 6:
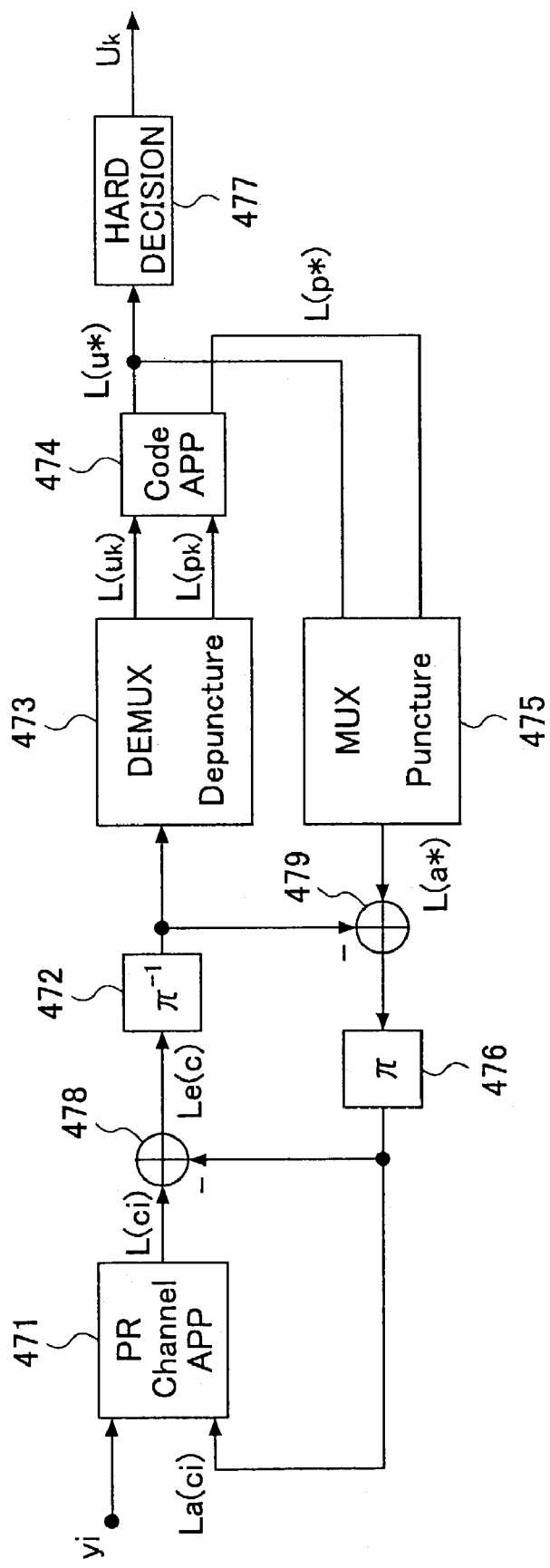
FIG. 6 is a block diagram illustrating an exemplary structure of the iterative decoder in the read system of the device shown in FIG. 4.

As previously mentioned, the iterative decoder 47 has a decoder corresponding to the encoding function of the encoder 31 and the PR channel within the read system, and may have, for example, a structure as shown in FIG. 6.

In FIG. 6, the iterative decoder 47 has a PR channel decoder 471, a deinterleaver ($\pi^{-1}$) 472, a divider 473, a code decoder 474, a combiner 475, an interleaver ($\pi$) 476, and a hard decision unit 477.

The PR channel decoder 471 is a decoder corresponding to the encoding function of the previously-described PR channel, and performs a posteriori probability (APP) decoding. Specifically, a logarithmic likelihood ratio $L(ci^*)$ is computed based on the ratio of the probability $P(ci=1|Y)$ of the bit ci being "1" to the probability $P(ci=0|Y)$ of the bit ci being "0" when the input sample value Y (y1, y2, . . . , yn) is detected.

$$L(ci^*) = \ln\{P(ci = 1|Y)/P(ci = 0|Y)\} \quad (4)$$

Each of the above-mentioned probabilities are calculated based on a trellis diagram showing the state transition of the sample value yi.

Since the logarithmic likelihood ratio $L(ci^*)$ is computed according to the above equation (4), the ratio will have a value within a threshold value successively representing the maximum probability of the bit ci being "1" to the maximum probability of the same bit ci being "0" in the range between a positive value L max and a negative value L min.

From the likelihood information L (ci*) output by the PR channel decoder 471, prior information La(ci) based on the output from the code decoder 474, which will be described later on, is subtracted in the subtractor 478 to obtain external likelihood information Le(c).

The sequence of external likelihood information Le (c) successively obtained in the above-described manner is rearranged in the deinterleaver ($\pi1^{-1}$) 472 and is supplied to the divider 473. The divider 473 divides the successively input likelihood information sequence into a sequence of likelihood information L (uk) corresponding to data bit uk and the likelihood information L(pk) corresponding to parity bit pk. Also, during the division process, information is added (depuncture function) according to a rule corresponding to the rule for thinning out the bits in the encoding process (the puncture function of combiner 32).

The code decoder 474 is a decoder corresponding to the encoder 31 of the previously-described write system and performs an a posteriori probability (APP) decoding process. Specifically, the code decoder 474 calculates the logarithmic likelihood ratio $L(u^*)$ represented as the APP (the probability of uk=1 and the probability of uk=0) of the data bit and the logarithmic likelihood ratio $L(p^*)$ represented as the APP (the probability of pk=1 and the probability of pk=0) of the parity bit, based on the prior information L(uk), which is the likelihood information on the data bit, and prior information L(pk), which is the likelihood information on the parity bit.

The sequence of the logarithmic likelihood ratio $L(u^*)$ and the sequence of the logarithmic likelihood ratio $L(p^*)$ successively output from the above code decoder 474 are supplied to the combiner 475. The combiner 475 combines the sequence of the logarithmic likelihood ratio $L(u^*)$ and the sequence of the logarithmic likelihood ratio $L(p^*)$, and thins out the information (puncture function) according to a predetermined rule. As a result, likelihood information $L(a^*)$ is output from the combiner 475.

Then prior information Le(c) (the state of the information before being divided into L(uk) and L(pk)) supplied to the above code decoder 474 is subtracted from the above-described likelihood information $L(a^*)$ by means of a subtractor 479. The resulting product of this process is supplied to the interleaver ($\pi$) 476.

The output of the interleaver ($\pi$) 476 is supplied to the above-described PR channel decoder 471 as prior information La(ci), as well as to the subtractor 478.

In the iterative decoder 47 having the PR channel decoder 471 and the code decoder 474 as described, one of the decoders iteratively performs a decoding process using the prior information supplied from the other decoder (iterative decoding).

The hard decision unit 477 determines whether data bit Uk is "1" or "0" based on the logarithmic likelihood ratio $L(u^*)$ of data bit uk output from the code decoder 474 after the above iterative decoding process is performed for a predetermined number of times, and then, the hard decision unit 477 outputs the data bit Uk with the determined value. As previously mentioned, the logarithmic likelihood ratio $L(u^*)$ has a positive value when the probability of the bit uk being "1" is greater than the probability of it being "0", and has a negative value when the probability of the bit uk being "1" is less than the probability of it being "0". Thus, the hard decision unit 477 generates data bit Uk by performing a hard decision on the logarithmic likelihood ratio $L(u^*)$ using the slice level "0".

The controller 48 has a CRC (Cyclic Redundancy Check) processing unit, and, for example, controls the number of iterations of the decoding process performed in the iterative decoder 47 according to the procedures shown in FIG. 7.

In FIG. 7, upon the initiation of a data regeneration process, the controller 48 allows the iterative decoding in the iterative decoder 47 (S1). In this way, the iterative decoder 47 performs a decoding process on a predetermined quantity of sample values accumulated in the memory unit 46. A check bit, which accompanies the CRC, is attached to the recorded data beforehand, and the CRC processing unit of the controller 48 performs CRC computation on the decoded data based on the check bits. Then, the controller 48 performs a level decision process (S2) of the error rate of the decoded data based on the computation results.

In the level decision of the error rate, two levels, namely, level 1 and level 2 are used. Level 1 is the level corresponding to the error rate that is not expected to experience sufficient change in its error state of decoded data even after repeating the decoding process for a predetermined number of times and is therefore not correctable in the ECC decoding circuit 50. Level 2 is the level corresponding to the maximum error rate that is correctable in the ECC decoding circuit 50 of the iterative decoder 47.

In the above described level decision of the error rate (S2), if the error rate obtained through CRC computation is within the following range:

level 1>error rate>level 2

(case ① in S2), the controller 48 allows the decoding process in the iterative decoder to continue (S1) provided that the error state of the decoded data is still not correctable in the ECC decoding circuit 50. As a result, the iterative decoder 47 will keep on repeating the decoding process. In turn, the CRC processing unit of the controller 48 repeats the CRC computation on the decoded data obtained through the above decoding process. Then, the controller 48 performs the level decision of the error rate of the decoded data based on the above computation (S2).

When the error rate obtained from the above CRC computation is greater than level 2, the controller 48 continues to allow the decoding process by the iterative decoder 47 (S1), and the decoding process of the iterative decoder is repeated (S1→S2①→S1 . . . ). In this process, the reliability of the decoded data obtained in the iterative decoder is increased, and when the error rate obtained through the CRC computation goes below level 2, (② in S2), the controller 48 outputs a stop signal for the decoding process of the iterative decoder 47 (S3). The iterative decoder stops the decoding process in response to this stop signal, and supplies the decoded data obtained in the last process (hard decision result) to the ECC decoding circuit 50.

The decoded data supplied from the iterative decoder 47 to the ECC decoding circuit 50 is not completely error-free (there is still a possibility of a bit error occurring at an error rate around level 2). However, a bit error at this error rate can be corrected by the ECC decoding circuit 50. Thus, by having the ECC decoding circuit 50 perform an error correction decoding process to the decoded data supplied from the iterative decoder 47, the decoded data obtained in the final stage will be error-free.

On the other hand, when the error rate of the first decoded data from the first decoding process by the iterative decoder 47 obtained through CRC computation is greater than level 1 (③ in S2), the controller 48 performs transition control so as to enter a retrial mode. As a result, the data regeneration process is repeated in the read system.

By implementing the above-described process in the read system, the number of iterations of the decoding process performed in the iterative decoder 47 will not always be the same, but instead will vary depending on the quality of the signals read out from the magneto-optic disk 110. The better the quality of the signals read out, the fewer iterations of the decoding process needed in the iterative decoder 47 to obtain an error rate of the decoded data that is below level 2. Also, even when the quality of the signals read out is very poor, the iterative decoder 47 can still realize an error rate that is below level 2 by increasing the number of iterations of the decoding process.

Further, the decoding process can be repeated until reaching the point at which error correction of the decoded data is possible (the error rate is below level 2) in the error correction decoding process of the ECC decoding circuit 50. Thus, it is possible to reduce the number of iterations of the decoding process while making full use of the functions of the ECC decoding circuit 50.

In the above example, an error rate at level 2, which is the condition for stopping the iteration of the above-described decoding process, is set to the level corresponding to the maximum error rate that can be corrected in the ECC decoding circuit 50. However, level 2 can be set to an error rate (≠0) that is less than the maximum error rate. Nonetheless, setting level 2 to the level corresponding to the maximum error rate correctable in the ECC decoding circuit 50 as in the above example enables optimal use of the capacity of the ECC decoding circuit 50 and the number of iterations of the decoding process can be reduced further.

Also, in the process described above, when the error rate of the decoded data obtained from the above first decoding process is above level 1, which corresponds to the error rate of decoded data that is not expected to experience sufficient change in its error state even after performing the decoding process for a predetermined number of times and is therefore not correctable in the ECC decoding circuit 50, the subsequent decoding process will not be performed and instead, the regenerating process will be retried. Thus, the meaningless repetition of the decoding process can be avoided.

Additionally, the predetermined number of iterations of the decoding process presumed to be performed for the decision of the level 1 corresponding to the error rate which qualifies for a retrial of the above regeneration process, is determined based on the capacity of the iterative decoder as well as the performance of the data regenerating apparatus. Although in the above example the error rate of the decoded data obtained after the first decoding process is used to determine the necessity of a retrial of the regenerating process, the retrial decision may also be made based on the error rate of the decoded data obtained after performing the decoding process for a fixed number of times. However, ideally, the above mentioned fixed number is significantly smaller than the predetermined number of iterations presumed for the decision of the level 1. In this case, level 1, which is the condition for retrying the regenerating process, is established according to the above fixed number of the decoding process performed before making the above retrial decision.

The process relating to the retrial of the above regenerating process can be performed independently of the process relating to controlling the number of iterations of the decoding process. Thus, the above process relating to the retrial of the regenerating process can be implemented, for example, in a read system having an iterative decoder 47 that always performs decoding for a fixed number of times.

The logarithmic likelihood ratio L(u*) obtained in the iterative decoder 47 corresponds to the ratio of the probability of the bit ci being "1" to the probability of the bit ci being "0", as previously described. Thus, the histogram of the logarithmic likelihood ratio L(u*) obtained from the iterative decoder 47 separates into two portions, namely, a portion with a peak at a positive value at which the bit ci is more likely "1" and a portion with a peak at a negative value at which the bit ci is more likely "0". When the number of iterations of the decoding process is small (e.g. 2 iterations in FIG. 8), the portion with a positive value as its peak and the portion with a negative value as its peak in the histogram are positioned relatively close to each other in the vicinity of the area of $L(u^*)=0$. In such case, there will be a relatively high possibility of the logarithmic likelihood ratio being misinterpreted as having a negative value when its real value is positive, or to the contrary, the logarithmic likelihood ratio being assumed to be positive when it is really negative.

As the number of iterations of the decoding process is increased (e.g. increasing the number of iterations from 2 to 4, 4 to 6, and 6 to 8 in FIG. 8), the above portion having a positive value as its peak and the portion having a negative value as its peak are distanced away from the area of $L(u^*)=0$. This means that by increasing the number of iterations of the process, a higher reliability of the hard decision result at slice level "0" from the obtained logarithmic likelihood ratio can be achieved.

Figure 8A:
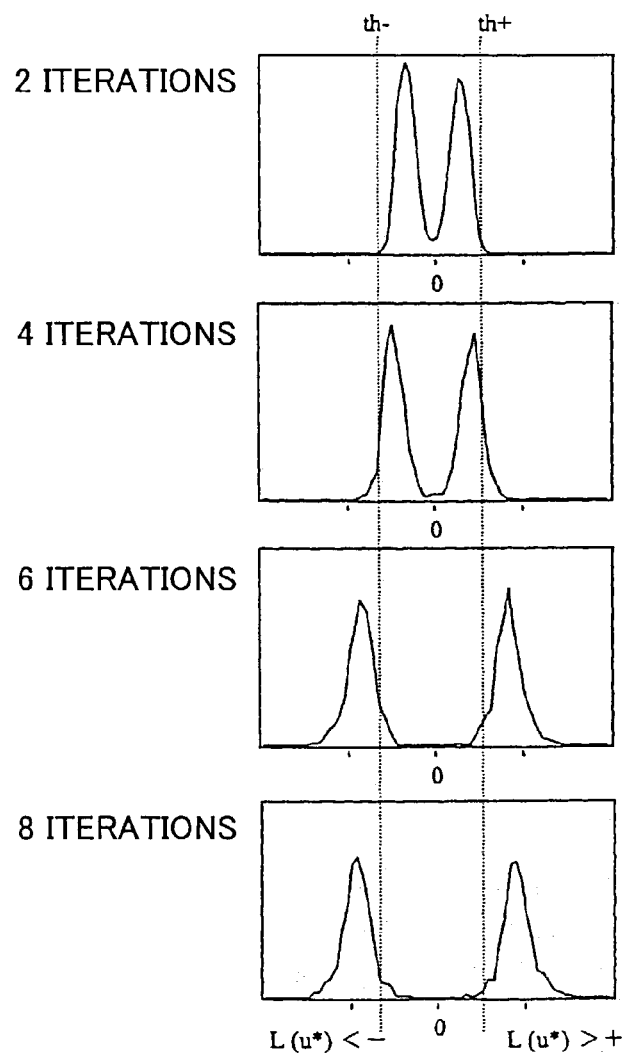
FIGS. 8A and 8B show the transition of the histograms of the logarithmic likelihood ratio $L(u^*)$ according to the number of iterations of the decoding process.
Figure 8B:
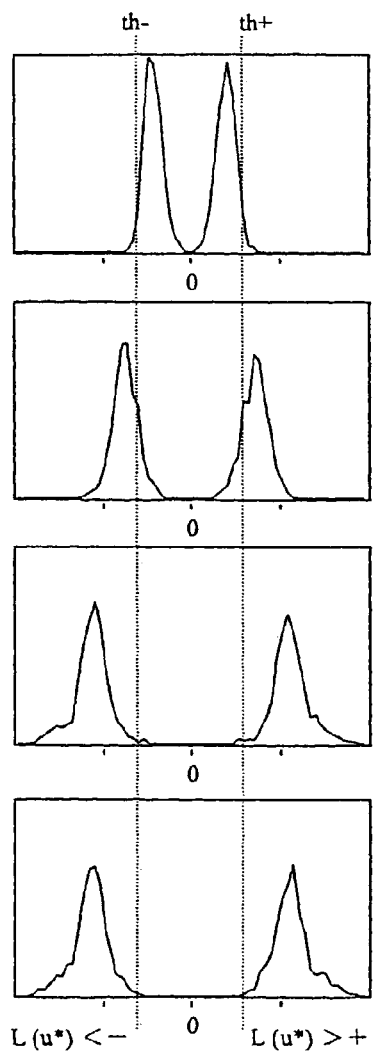

Also, even when the number of iterations of the decoding process is the same, the peak positions in the histogram of the logarithmic likelihood ratio may vary depending on the quality of the readout signals (e.g. S/N). The poorer the quality of the readout signals, the closer the positive peak position and negative peak position in the histogram of the logarithmic likelihood ratio are to the area around $L(u^*)=0$. FIG. 8A shows the histogram of the logarithmic likelihood ratio in the case in which the quality of the readout signal is relatively poor, and FIG. 8B shows the histogram of the logarithmic likelihood ratio in the case in which the quality of the readout signal is relatively good.

By making use of the fact that the histogram of the logarithmic likelihood ratio obtained according to the number of iterations of the decoding process performed in the iterative decoder 47 can vary, the number of iterations of the decoding process in the iterative decoder 47 can be controlled to an appropriate number. In this case, the read system of the data recording/regenerating apparatus has a histogram generating unit 49 as shown in FIG. 9.

Figure 9:
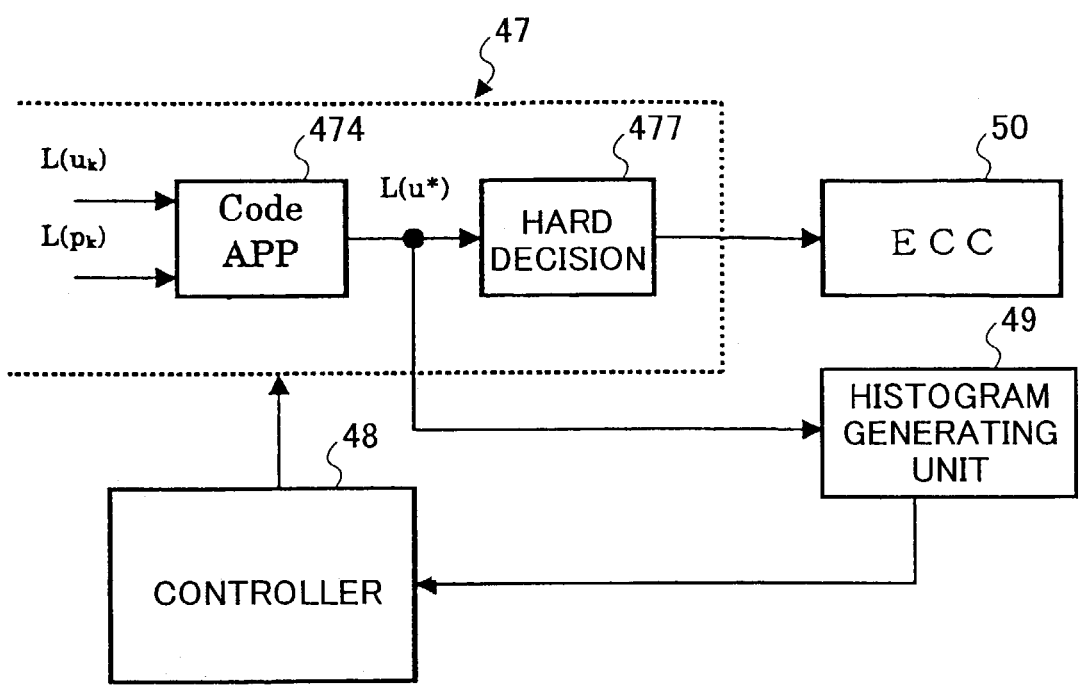
FIG. 9 is a block diagram illustrating an exemplary structure for controlling the number of iterations of the decoding process.

The histogram generating unit 49 shown in FIG. 9 inputs the logarithmic likelihood ratio $L(u^*)$ from the code decoder 474 of the iterative decoder 47 and generates the histogram of the logarithmic likelihood ratio $L(u^*)$. The histogram generating unit 49 supplies the positive peak position (the value of the logarithmic likeliness ratio that has the highest frequency) and the negative peak position to the controller 48. The controller 48 may, for example, control the number of iterations of the decoding process in the iterative decoder 47 according to the procedures shown in FIG. 10.

In FIG. 10, the controller 48 allows the decoding process in the iterative decoder 47 when the data regenerating process is initialized (S11). In this way, the iterative decoder 47 performs a decoding process on a predetermined quantity of sample values accumulated in the memory unit 46. In the above process, the logarithmic likelihood ratio $L(u^*)$ output from the code decoder 474 of the iterative decoder 47 is successively supplied to the histogram generating unit 49. The histogram generating unit 49 generates the histogram of the above logarithmic likelihood ratio obtained during the decoding process on the above predetermined quantity of sample values, and supplies information on its positive peak position and negative peak position to the controller 48.

The controller 48 determines whether or not the absolute value of the positive peak position and the negative peak position of the histogram generated in the histogram generating unit 49 have reached a predetermined level th (S12). The controller 48 continues to allow the decoding process in the iterative decoder 47 if the absolute value of the positive peak position and the negative peak position do not reach the predetermined level th (S12→S11). As a result, the iterative decoder 47 performs the decoding process' over again. Here, the histogram generating unit 49 regenerates the histogram of the logarithmic likelihood ratio $L(u^*)$ obtained in the retried decoding process, and supplies information on the positive peak position and negative peak position of the histogram to the controller 48.

The controller 48 continues to allow the decoding process until the absolute value of the positive peak position and negative peak position of the histogram of the logarithmic likelihood ratio supplied from the histogram generating unit 49 reach the above mentioned predetermined level th. Consequently, the iterative decoder 47 iteratively performs the decoding process (S11→S12→S11→ . . . ).

The predetermined value th, which is the basis for comparing the absolute values of the positive peak position and the negative peak position of the histogram of the logarithmic likelihood ratio $L(u^*)$ obtained during the decoding process is determined according to the following procedures.

As previously described (refer to FIG. 8), when the number of iterations of the decoding process is small, the positive peak position and the negative peak position of the histogram of the logarithmic likelihood ratio $L(u^*)$ obtained during the decoding process are situated around the vicinity of the $L(u^*)=0$. The error rate of the decoded data, obtained under the above conditions through hard decision processing of the logarithmic likelihood ratio $L(u^*)$ using the slice level $L(u^*)=0$, is usually quite high (i.e. the reliability is low). When the number of iterations of the decoding process increases, the positive peak position and the negative peak position of the histogram of the logarithmic likelihood ratio $L(u^*)$ obtained during the decoding process are distanced apart from the area of $L(u^*)=0$. The error rate of the decoded data obtained under these conditions through hard decision processing of the logarithmic likelihood ratio $L(u^*)$ using the slice level $L(u^*)=0$ is lower (i.e. its reliability is higher).

Thus, the above predetermined level th is determined based on the absolute value of the positive peak position and the negative peak position in the distribution of the logarithmic likelihood ratio $L(u^*)$ (histogram) wherein the error rate of the decoded data obtained through hard decision processing of the logarithmic likelihood ratio $L(u^*)$ is a predetermined error rate that is most likely correctable in the ECC decoder 50 (e.g. the maximum correctable error rate).

In a case in which the above absolute value of the positive peak position and the negative peak position in the histogram of the logarithmic likelihood ratio $L(u^*)$ obtained during the decoding process have not reached the predetermined level th, the errors in the decoded data obtained through hard decision processing of the logarithmic likelihood ratio $L(u^*)$ may not be sufficiently corrected in the ECC decoder circuit 50 and thus the above described decoding process is iteratively performed. In this process, when the absolute values of the positive peak position and the negative peak position of the histogram of the logarithmic likelihood ratio $L(u^*)$ supplied from the histogram generating unit 49 reach the above predetermined level th determined accordingly, the controller 48 outputs a stop signal for stopping the decoding process to the iterative decoder 47 (S13). In response the stop signal, the iterative decoder 47 stops the decoding process, and supplies the decoded data obtained therein (the hard decision result) to the ECC decoder circuit 50.

The decoded data supplied to the ECC decoding circuit 50 from the iterative decoder 47 may not be completely error-free; however, the bit errors at such error rate can be corrected in the ECC decoding circuit 50. Thus, a final error-free set of decoded data can be obtained by having the ECC decoding circuit 50 perform a correction decoding process on the decoded data supplied from the iterative decoder 47.

Also, if the signal-to-noise (S/N) ratio of the readout signal is high (if the quality of the readout signal is good), decoded data with a low bit error rate can be achieved even when few iterations of the decoding process are performed. However, if the S/N ratio of the readout signal is low (if the quality of the readout signal is poor), decoded data with a low bit error rate cannot be achieved unless the number of iterations of the decoding process is increased. Thus, the number of iterations is determined by estimating the quality of the readout signal.

The quality of the readout signal can be determined based on the histogram (distribution state) of the sample values $y_i$ of the readout signal equalized into a PR waveform.

Figures 11A, 11B:
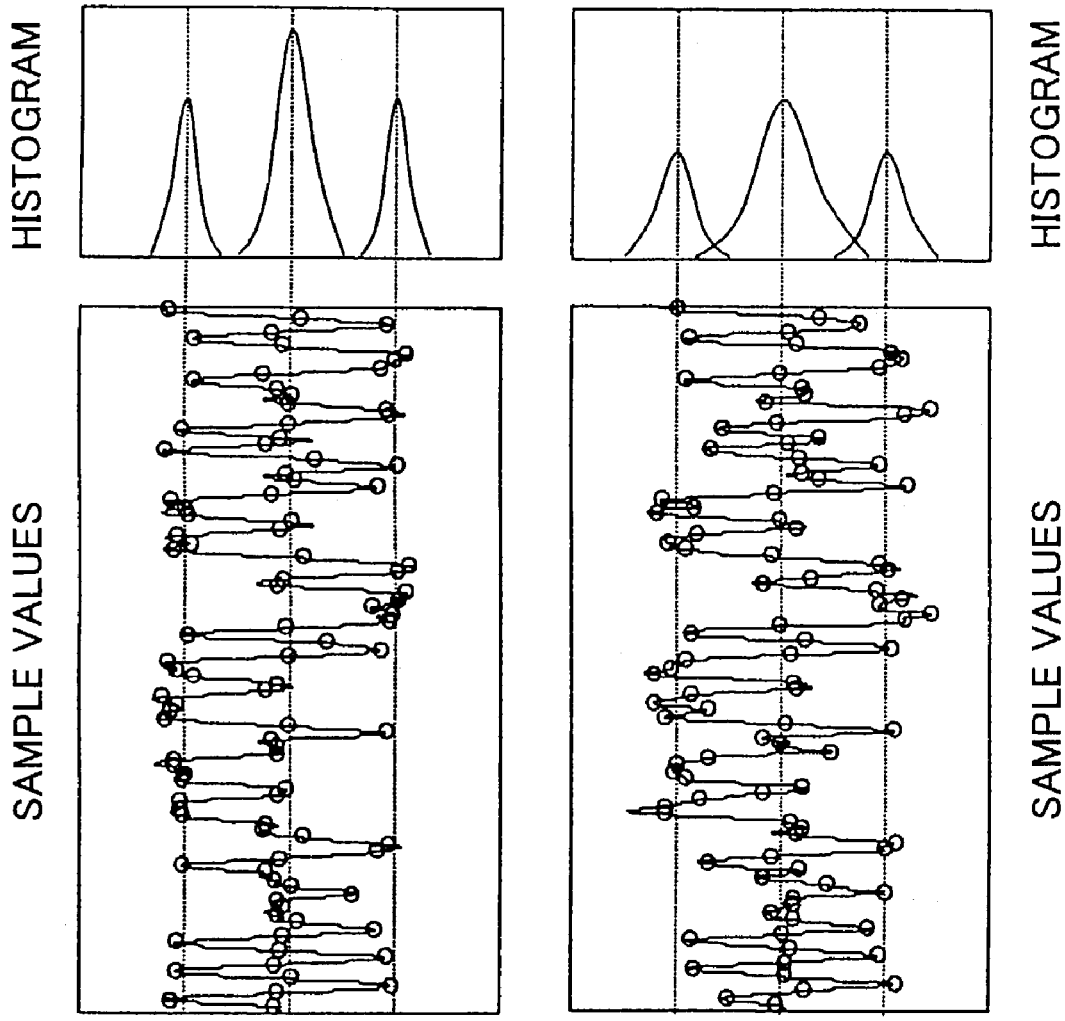
FIGS. 11A and 11B show examples of the sample values of the readout signal and the corresponding histograms.

For example, waveform PR (1, 1) has three estimation values. Thus, the histogram of the sample values $y_i$ of the readout signal equalized into waveform PR (1, 1) has three peaks as shown in FIG. 11. Specifically, FIG. 11A shows the histogram of the sample values $y_i$ of a readout signal with a relatively high S/N ratio wherein a relatively sharp and distinct distribution is shown. FIG. 11B shows the histogram of the sample values of a readout signal with a relatively low S/N ratio wherein the distribution of the values is relatively spread out. The number of iterations of the decoding process can be determined based on the standard deviation of the histogram of the sample values $y_i$ of the readout signal. In this case, the controller 48 may have a structure as shown in FIG. 12.

Figure 12:
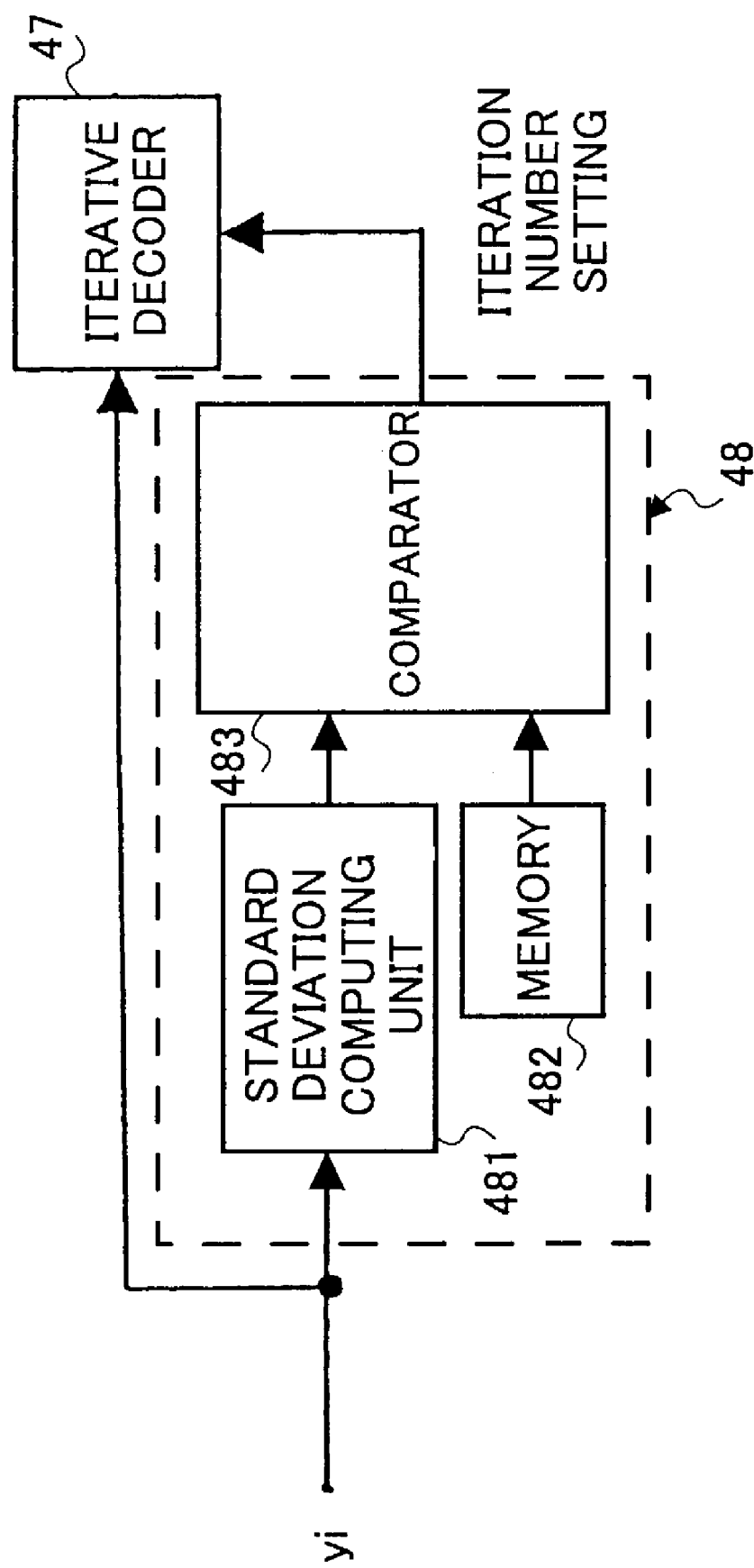
FIG. 12 is a block diagram illustrating an exemplary structure for controlling the number of iterations of the decoding process in the controller.

In FIG. 12, the controller has a standard deviation computing unit 481, a memory 482, and a comparator 483. The standard deviation computing unit 481 successively inputs sample values $y_i$ of a predetermined quantity stored in the memory unit 46 (refer to FIG. 4), produces a histogram therefrom, and computes its standard deviation. The memory 482 has a table indicating the number of iterations of the decoding process corresponding to each standard deviation range of the sample values $y_i$. The correlation between the standard deviation range of the sample values $y_i$ and the number of iterations of the decoding process is determined in the following manner. Namely, each pre-established standard deviation range of sample values is correlated with the number of iterations of the decoding process that can produce decoded data with a predetermined error rate correctable in the ECC decoding circuit 50 (e.g. the maximum correctable error rate) generated from a readout signal with a quality (S/N ratio) that can be estimated from each standard deviation range.

The comparator 483 compares the standard deviation computed in the standard deviation computing unit 481, and the table indicating the number of iterations of the decoding process corresponding to each standard deviation range which is stored in the memory 482, so as to obtain the number of iterations corresponding to the standard deviation range under which the computed standard deviation falls. Then, the number of iterations obtained in the comparator 483 is established in the controller 48 and is notified to the iterative decoder 47. The iterative decoder 47 iteratively performs the decoding process on the sample values $y_i$ of a predetermined quantity stored in the memory unit 46 for the number of times notified by the above controller 48. The decoded data obtained from the above process is supplied to the ECC decoding circuit 50 via the iterative decoder 47.

As in the other examples described, the above decoded data supplied to the ECC decoding circuit 50 via the iterative decoder 47 may not be completely error-free; however, the bit errors at such error rate can be corrected at the ECC decoding circuit 50. Thus, the final error-free decoded data can be obtained by the error correction decoding process of the ECC decoding circuit 50 performed on the decoded data supplied from the iterative decoder 47.

Figure 13:
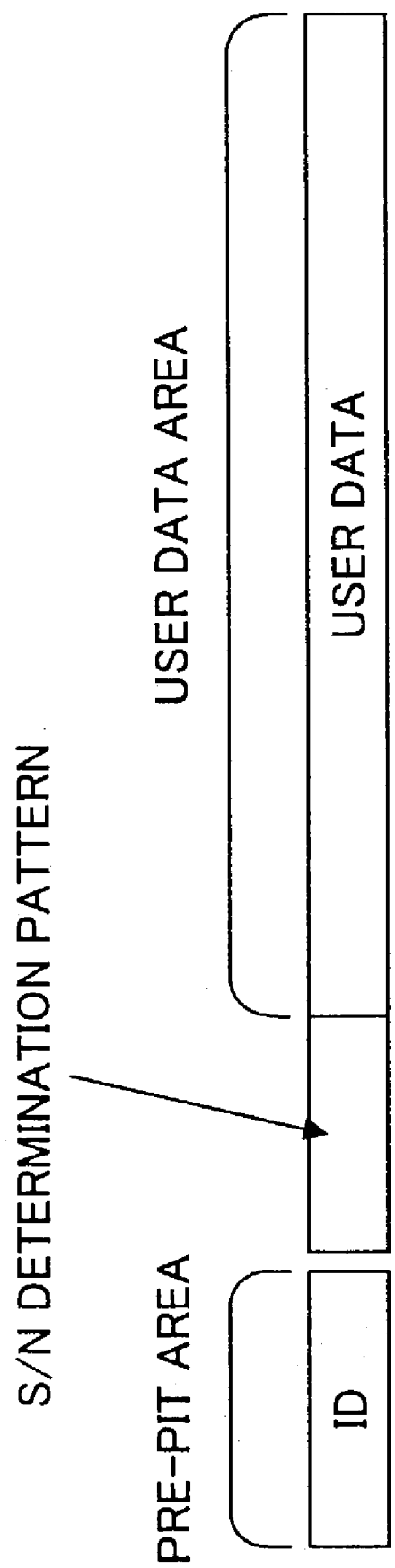
FIG. 13 shows an exemplary format of the recorded data.

Further, the number of iterations of the decoding process may also be determined by directly detecting the quality (S/N ratio) of the regenerating signal and using this as a basis of decision. In this case, on each of the recording tracks of the magneto-optic disk 110, an area onto which a pattern is written for determining the S/N ratio is formed between the pre-pit area onto which TD information is written and the user data area onto which user data is written, as shown in FIG. 13. Preferably, the pattern for determining the S/N ratio is a repetitive pattern (e.g. minimum mark length pattern). The bit length of the pattern is not particularly restricted. Also, a VFO pattern, which is used in a conventional optical disk, may be used as the above S/N ratio decision pattern.

Figure 14:
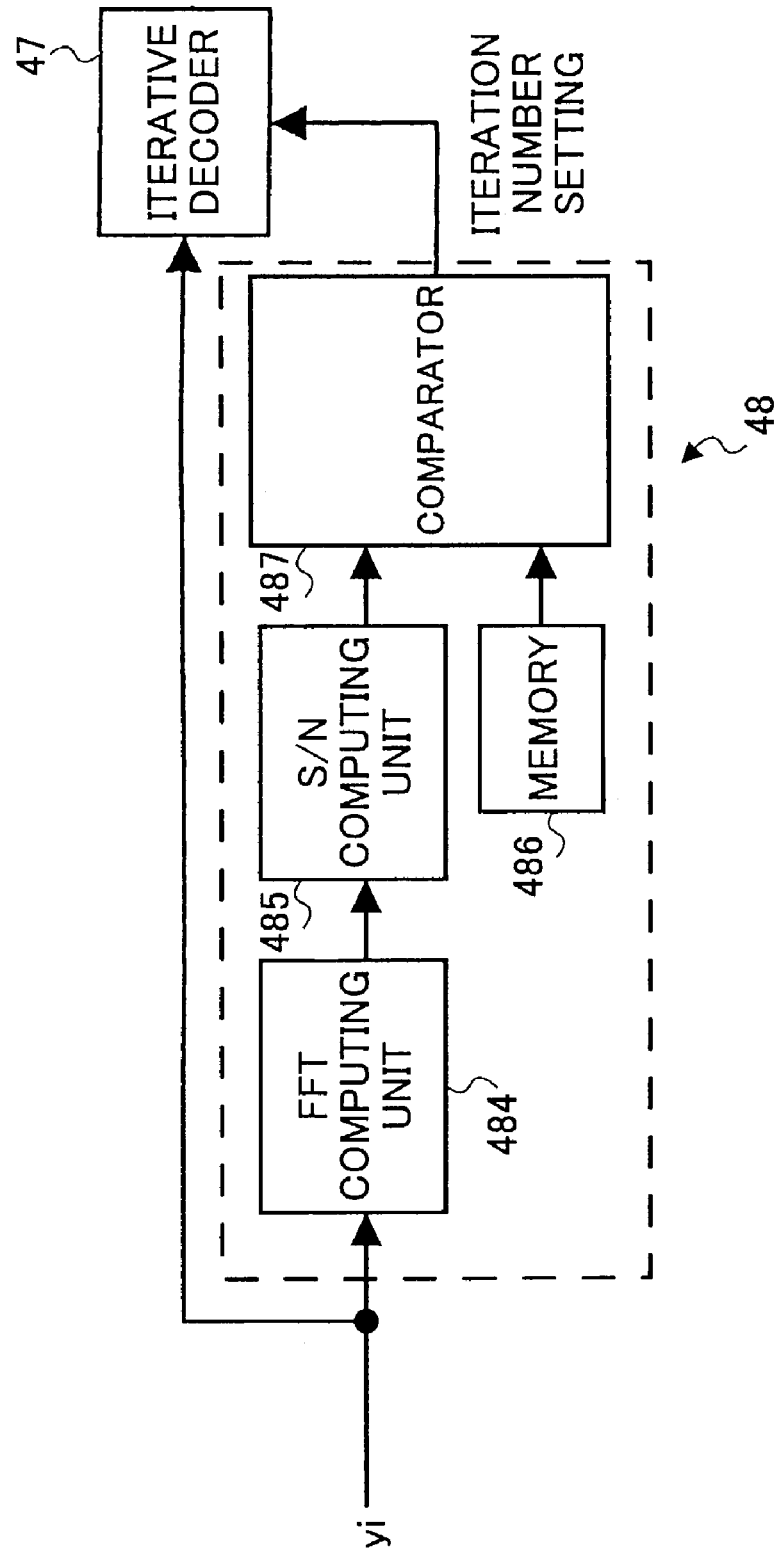
FIG. 14 is a block diagram illustrating another exemplary structure for controlling the number of iterations of the decoding process in the controller; and, FIG. 15 shows an example of the FFT computation result of the sample value sequence of the readout signal.

In such case, the controller 48 has a structure as shown in FIG. 14.

Figure 15:
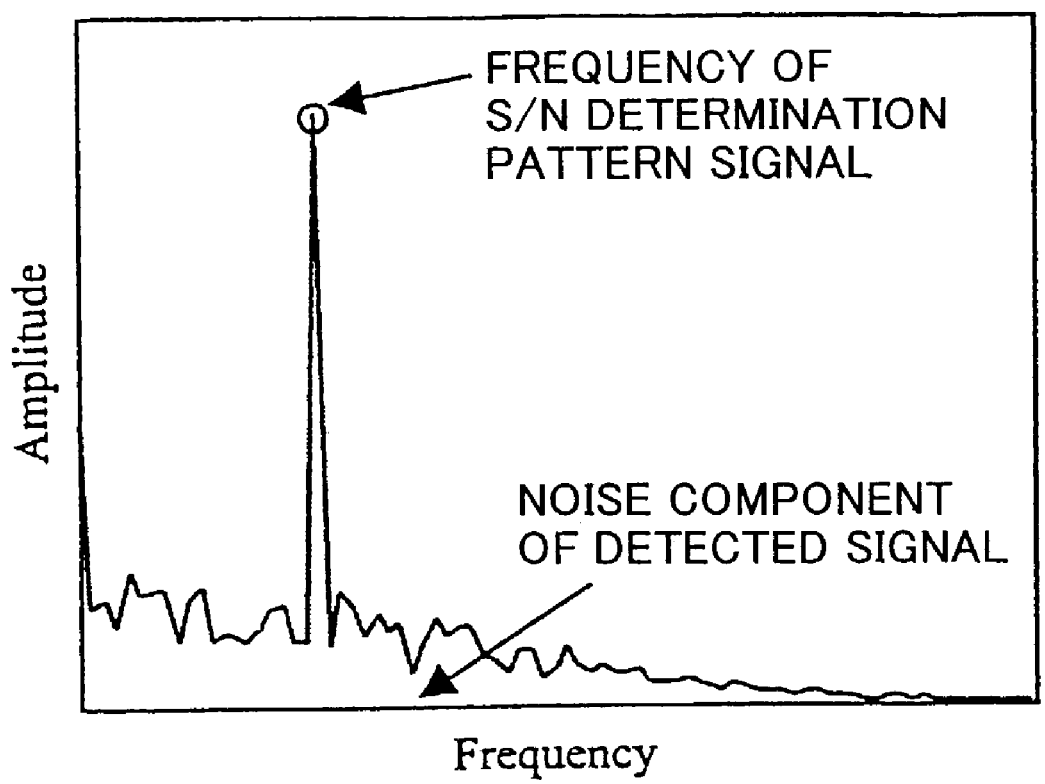

In FIG. 14, the controller 48 has an FFT (Fast Fourier Transform) computing unit 484, an S/N computing unit 485, a memory 486, and a comparator 487. The FFT computing unit 484 computes the frequency component of the readout signal from the sample values of the readout signal obtained upon the scanning by the optical head of the area where the above S/N ratio decision pattern is written (refer to FIG. 13) using an FFT algorithm. The S/N computing unit 485 computes the S/N ratio based on the amplitude of the frequency component of the S/N decision pattern signal itself, included in the frequency component of the readout signal obtained in the FFT computing unit, and the amplitude of other frequency components, as shown in FIG. 15.

The memory 487 has a table indicating the number of iterations of the decoding process corresponding to each S/N ratio range of the readout signal. The correlation between the S/N ratio range of the readout signal and the number of iterations of the decoding process can be determined in the following manner. Namely, each pre-established S/N ratio range of the readout signal is correlated with the number of iterations of the decoding process that can produce decoded data of a predetermined error rate correctable in the ECC decoding circuit 50 (for example, the maximum correctable error rate) generated from a readout signal of each S/N ratio range.

The comparator 487 compares the S/N ratio computed in the S/N ratio computing unit 485 and corresponding to the S/N ratio decision pattern, and the table indicating the number of iterations of the decoding process corresponding to each S/N ratio range stored in the memory 486, so as to obtain the number of iterations corresponding to the S/N ratio range under which the computed S/N ratio falls. Then, the number of iterations obtained in the comparator 487 is established in the controller 48 and is notified to the iterative decoder 47.

The sample values $y_i$ of the readout signal obtained upon the scanning of the user data by the optical head are successively stored in the memory unit 46. Then, the iterative decoder 47 iteratively performs the decoding process on a predetermined quantity of sample values $y_i$ stored in the memory unit 46 for the number of times notified by the controller 48. The decoded data obtained from the above process is then supplied to the ECC decoding circuit 50 via the iterative decoder 47.

As in the other examples described, the above decoded data supplied to the ECC decoding circuit 50 via the iterative decoder 47 may not be completely error-free; however, the bit errors at such error rate can be corrected at the ECC decoding circuit 50. Thus, the final error-free decoded data can be obtained through the error correction decoding process of the ECC decoding circuit 50 performed on the decoded data supplied from the iterative decoder 47.

In each of the above examples, the standard level th (refer to FIG. 8) of the logarithmic likelihood ratio, the relationship between the standard deviation range and the number of iterations (refer to FIGS. 11 and 12), and the relationship between the S/N ratio range and the number of iterations (refer to FIGS. 13 through 15) may also be determined based on an estimated number of iterations of the decoding process required for producing error-free decoded data.

In each of the above examples, a part of the functions of the controller 48 corresponds to the error state detection means, the process in S2 shown in FIG. 7 (① and ②) corresponds to the first determination means, and the process of S3 shown in FIG. 7 corresponds to the decoding control means. Also, the processes of S2 (③, and ① or ②) shown in FIG. 7 correspond to the second determination means, and the process of the controller 48 according to ③ shown in FIG. 7 corresponds to the retrial control means.

The histogram generating unit 49 shown in FIG. 9 and the process of S12 shown in FIG. 10 correspond to the iteration number control means. Specifically, the process in S12 corresponds to the detection means and the process in S13 shown in FIG. 10 corresponds to decoding control means.

The standard deviation computing unit 481 shown in FIG. 12, or the FFT computing unit 484 and the S/N ratio computing unit 487 shown in FIG. 14 correspond to the quality information detection means; and the table stored in the memory 482 of FIG. 12 and the comparator 483, or the table stored in the memory 486 of FIG. 14 and the comparator 487 correspond to the iteration number control means.

In conclusion, the data regenerating apparatus according to the present invention is capable of controlling the number of iterations of the decoding process according to the iterative decoding technique while also taking into account the correctable error state of the decoded data, the distribution state of the likelihood information obtained in the decoding process, or the quality of the readout signal. Thus, the accuracy and precision of the data decoding process can be greatly improved while the degradation of the transfer rate is kept down to a minimum.

What is claimed is:

1. A data regenerating apparatus that generates decoded data by performing a decoding process on a readout signal from a storage medium according to an iterative decoding technique corresponding to a turbo coding technique, and regenerates recorded data by performing a predetermined error correction process on said decoded data, said data regenerating apparatus comprising:
an error state detector configured to detect an error state of said decoded data;
a first determination unit configured to determine whether or not the error state of the decoded data detected by said error state detector is correctable using said predetermined error correction process; and,
a decoding controller configured to stop said decoding process when it is determined by said first determination unit that the error state of said decoded data is correctable using said predetermined error correction process.

2. The data regenerating apparatus as claimed in claim 1, further comprising:
a second determination unit configured to determine whether or not the error state detected by said error state detector for the decoded data obtained upon performing the decoding process for a predetermined number of times according to said iterative decoding technique has more errors compared to a predetermined standard error state; and,
a retrial controller configured to retry the process of regenerating said recorded data when it is determined by said second determination unit that the error state detected by said error state detector has more errors than the predetermined standard error state.

3. The data regenerating apparatus as claimed in claim 2, wherein:
said second determination unit determines whether or not the error state detected by said error state detector for the decoded data obtained upon performing said decoding process once has more errors compared to the predetermined standard error state.

4. A data regenerating apparatus that generates decoded data by performing a decoding process on a readout signal from a storage medium according to an iterative decoding technique corresponding to a turbo coding technique, and regenerates recorded data by performing a predetermined error correction process on said decoded data, said data regenerating apparatus comprising:
error state detection means for detecting an error state of said decoded data;
first determination means for determining whether or not the error state of the decoded data detected by said error state detection means is correctable using said predetermined error correction process; and,
decoding control means for stopping said decoding process when it is determined by said first determination means that the error state of said decoded data is correctable using said predetermined error correction process.

5. A data regenerating apparatus that generates decoded data by performing a decoding process on a readout signal from a storage medium according to an iterative decoding technique corresponding to a turbo coding technique, and regenerates recorded data based on said decoded data, said data regenerating apparatus comprising:
an iteration number controller configured to control the number of iterations of said decoding process based on a distribution state of likelihood information obtained during said decoding process according to the iterative decoding technique;
wherein said iteration number controller further comprises:
a determination unit configured to determine whether or not the distribution state of said likelihood information has higher reliability in a hard decision result of the likelihood information compared to that of a predetermined standard state; and,
a decoding controller configured to stop said decoding process when it is determined by said determination unit that the distribution state of said likelihood information has higher reliability in the hard decision result of the likelihood information compared to that of the predetermined standard state.

6. A data regenerating apparatus that generates decoded data by performing a decoding process on a readout signal from a storage medium according to an iterative decoding technique corresponding to a turbo coding technique, and regenerates recorded data based on said decoded data, said data regenerating apparatus comprising:

a quality information detector configured to detect quality information indicating the quality of the readout signal; and an iteration number controller configured to control the number of iterations of said decoding process based on the quality information detected by said quality information detector;

wherein:

said quality information detector further comprises a histogram generating unit configured to generate a histogram of sample values that are produced by sampling the readout signal in a predetermined cycle and are rendered to said decoding process; and, a quality information computing unit for computing information indicating the distribution state of the sample values represented in the histogram generated by said histogram generating unit as the quality information of the readout signal; and, said iteration number controller further comprises a first iteration number determination unit configured to determine the number of iterations of said decoding process based on said information indicating the distribution state of the sample values obtained in said quality information computing unit; and, performs said decoding process for the number of times determined by said first iteration number determination unit.

7. The data regenerating apparatus as claimed in claim 6, wherein:

said first iteration number determination unit comprises a first table indicating the number of iterations of the decoding process appropriate for each of a plurality of distribution states of the sample values; and, referring to said first table, determines said number of iterations of the decoding process by obtaining the number of iterations that corresponds to the information indicating the distribution state of the sample values obtained in said quality information computing unit.

8. A data regenerating apparatus that generates decoded data by performing a decoding process on a readout signal from a storage medium according to an iterative decoding technique corresponding to a turbo coding technique, and regenerates recorded data based on said decoded data, said data regenerating apparatus comprising:

a quality information detector configured to detect quality information indicating the quality of the readout signal;

an iteration number controller configured to control the number of iterations of said decoding process based on the quality information detected by said quality information detector;

wherein:

said quality information detector detects information indicating the amplitude of a noise component included in a readout signal with a predetermined pattern prerecorded on the storage medium as quality information of the readout signal of the recorded data; and, said iteration number controller comprises a second iteration number determination unit configured to determine the number of iterations of said decoding process based on said information indicating the amplitude of the noise component included in the readout signal of the predetermined pattern obtained in said quality information detector; and, performs said decoding process for the number of times determined by said second iteration number determination unit.

9. The data regenerating apparatus as claimed in claim 8, wherein:

said second iteration number determination unit comprises a second table indicating the appropriate number of iterations of the decoding process corresponding to each of a plurality of noise component amplitudes; and, referring to said second table, determines said number of iterations of the decoding process by obtaining the number of iterations corresponding to the information on the amplitude of the noise component included in the readout signal with said predetermined pattern obtained in said quality information detector.

10. A data regenerating apparatus that generates decoded data by performing a decoding process on a readout signal from a storage medium according to an iterative decoding technique corresponding to a turbo coding technique, and regenerates recorded data based on said decoded data, said data regenerating apparatus comprising:

a determination unit configured to determine whether or not the error state detected by an error state detector for the decoded data obtained upon performing the decoding process for a predetermined number of times according to an iterative decoding technique has more errors compared to a predetermined standard error state; and, a retrial controller configured to retry the process of regenerating said recorded data when it is determined by said determination unit that the error state detected by said error state detector has more errors than the predetermined standard error state.

11. The data regenerating apparatus as claimed in claim 10, wherein:

said determination unit determines whether or not the error state detected by said error state detector for the decoded data obtained upon performing said decoding process once has more errors compared to the predetermined standard error state.

12. A data regenerating apparatus that generates decoded data by performing a decoding process on a readout signal from a storage medium according to an iterative decoding technique corresponding to a turbo coding technique, and regenerates recorded data based on said decoded data, said data regenerating apparatus comprising:

determination means for determining whether or not the error state detected by an error state detection means for the decoded data obtained upon performing the decoding process for a predetermined number of times according to said iterative decoding technique has more errors compared to a predetermined standard error state; and, retrial control means for retrying the process of regenerating said recorded data when it is determined by said determination means that the error state detected by said error state detection means has more errors than the predetermined standard error state.

* * * * *